(12) United States Patent
Molinero Horno et al.

(10) Patent No.: US 12,066,500 B2
(45) Date of Patent: Aug. 20, 2024

(54) ELECTRICAL ASSEMBLY

(71) Applicant: Lear Corporation, Southfield, MI (US)

(72) Inventors: Ignacio Molinero Horno, Valls (ES); Eduardo De las Heras Palmero, Valls (ES); Antoni Ferré Fàbregas, Tarragona (ES)

(73) Assignee: Lear Corporation, Southfield, MI (US)

( * ) Notice: Subject to any disclaimer, the term of this patent is extended or adjusted under 35 U.S.C. 154(b) by 367 days.

(21) Appl. No.: 17/557,569

(22) Filed: Dec. 21, 2021

(65) Prior Publication Data

US 2023/0194627 A1    Jun. 22, 2023

(51) Int. Cl.
| | |
|---|---|
| *G01R 31/52* | (2020.01) |
| *G01R 31/40* | (2020.01) |
| *G05B 15/02* | (2006.01) |
| *G05F 1/70* | (2006.01) |
| *H01L 29/43* | (2006.01) |
| *H02J 7/00* | (2006.01) |
| *H02J 9/00* | (2006.01) |

(52) U.S. Cl.
CPC .............. *G01R 31/52* (2020.01); *G01R 31/40* (2013.01); *G05B 15/02* (2013.01); *G05F 1/70* (2013.01); *H01L 29/435* (2013.01); *H02J 7/00304* (2020.01); *H02J 9/005* (2013.01)

(58) Field of Classification Search
CPC ..................................................... G01R 31/52
USPC ....................................................... 307/125
See application file for complete search history.

(56) References Cited

U.S. PATENT DOCUMENTS

| | | | |
|---|---|---|---|
| 6,023,418 A * | 2/2000 | Engira | H02M 1/10 |
| | | | 363/63 |
| 6,922,322 B2 | 7/2005 | Strayer et al. | |
| 7,312,653 B2 | 12/2007 | Chen et al. | |
| 9,203,296 B2 | 12/2015 | Fauer et al. | |
| 9,573,540 B2 * | 2/2017 | Kanzaki | H02H 7/18 |
| 10,559,559 B2 * | 2/2020 | Lidsky | H02H 3/18 |

OTHER PUBLICATIONS

"HITFETs: Smart, Protected MOSFETs" https://www.infineon.com/dgdl/Infineon-ApplicationNote_v12-AN-v01_00- EN.pdf?fileId=5546d4625b62cd8a015bc8c8e5ae31d1; Jun. 2008; accessed Feb. 10, 2022.

(Continued)

*Primary Examiner* — Joseph Chang
(74) *Attorney, Agent, or Firm* — Fishman Stewart PLLC (57) ABSTRACT

An electrical assembly may include an electrical component, a first switch, and/or a second switch. The electrical component may include a closed state and an open state. The first switch may be connected in series with the second switch. The first switch and the second switch may be connected in parallel with the electrical component. The first switch and the second switch may be configured to provide a second electrical connection when the electrical component is in the open state. A method of operating an electrical assembly may include providing power from a power source to the electrical component, opening the electrical component, the first switch, and/or the second switch via a controller, closing a second electrical component via the controller, and/or providing a diagnostic current from the power source to a diagnostic load to determine a status of the power source.

19 Claims, 3 Drawing Sheets

(56) References Cited

OTHER PUBLICATIONS

"Reverse Polarity Protection Smart Diode Controller" https://www.ti.com/lit/ds/symlink/lm74610-q1.pdf?ts=1626355574769&ref_url=https%253A%252F%252Fwww.ti.com%252Flit%252Fgpn%252Flm74610-q1; Jun. 2016; accessed Feb. 10, 2022.
"Reverse Current Protection in Load Switches" https://e2e.ti.com/cfs-file/_key/communityserver-discussions-components-files/196/Reverse-Current-Protection-in-Load Switches_5F00_slva730.pdf; May 2016; accessed Feb. 10, 2022.
Design publicly available at least as early as Dec. 20, 2020.

\* cited by examiner

ELECTRICAL ASSEMBLY

TECHNICAL FIELD

The present disclosure generally relates to electrical assemblies, including assemblies that may include electrical relays and/or switches that may, for example, be used in connection with vehicles.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Some electrical assemblies do not provide sufficient functionality, are not configured to detect and/or protect against certain fault conditions, and/or require complicated assembly processes.

There is a desire for solutions/options that minimize or eliminate one or more challenges or shortcomings of electrical assemblies. The foregoing discussion is intended only to illustrate examples of the present field and is not a disavowal of scope.

SUMMARY

In embodiments, an electrical assembly may include an electrical component, a first switch, and/or a second switch. The first switch may be electrically connected to the electrical component. The second switch may be electrically connected to the electrical component and the first switch. The electrical component may include a closed state and an open state. The first switch may be connected in series with the second switch. The first switch and the second switch may be connected in parallel with the electrical component. The first switch and the second switch may be configured to provide a second electrical connection and/or a secondary current when the electrical component is in the open state.

With embodiments, a method of operating an electrical assembly may include providing power from a power source to the electrical component, opening the electrical component, the first switch, and/or the second switch via a controller, closing a second electrical component via the controller, and/or providing a diagnostic current from the power source to a diagnostic load to determine a status of the power supply.

The foregoing and other potential aspects, features, details, utilities, and/or advantages of examples/embodiments of the present disclosure will be apparent from reading the following description, and from reviewing the accompanying drawings.

BRIEF DESCRIPTION OF THE DRAWINGS

While the claims are not limited to a specific illustration, an appreciation of various aspects may be gained through a discussion of various examples. The drawings are not necessarily to scale, and certain features may be exaggerated or hidden to better illustrate and explain an innovative aspect of an example. Further, the exemplary illustrations described herein are not exhaustive or otherwise limiting, and embodiments are not restricted to the precise form and configuration shown in the drawings or disclosed in the following detailed description. Exemplary illustrations are described in detail by referring to the drawings as follows:

DETAILED DESCRIPTION

Reference will now be made in detail to embodiments of the present disclosure, examples of which are described herein and illustrated in the accompanying drawings. While the present disclosure will be described in conjunction with embodiments and/or examples, they do not limit the present disclosure to these embodiments and/or examples. On the contrary, the present disclosure covers alternatives, modifications, and equivalents.

Figure 1:
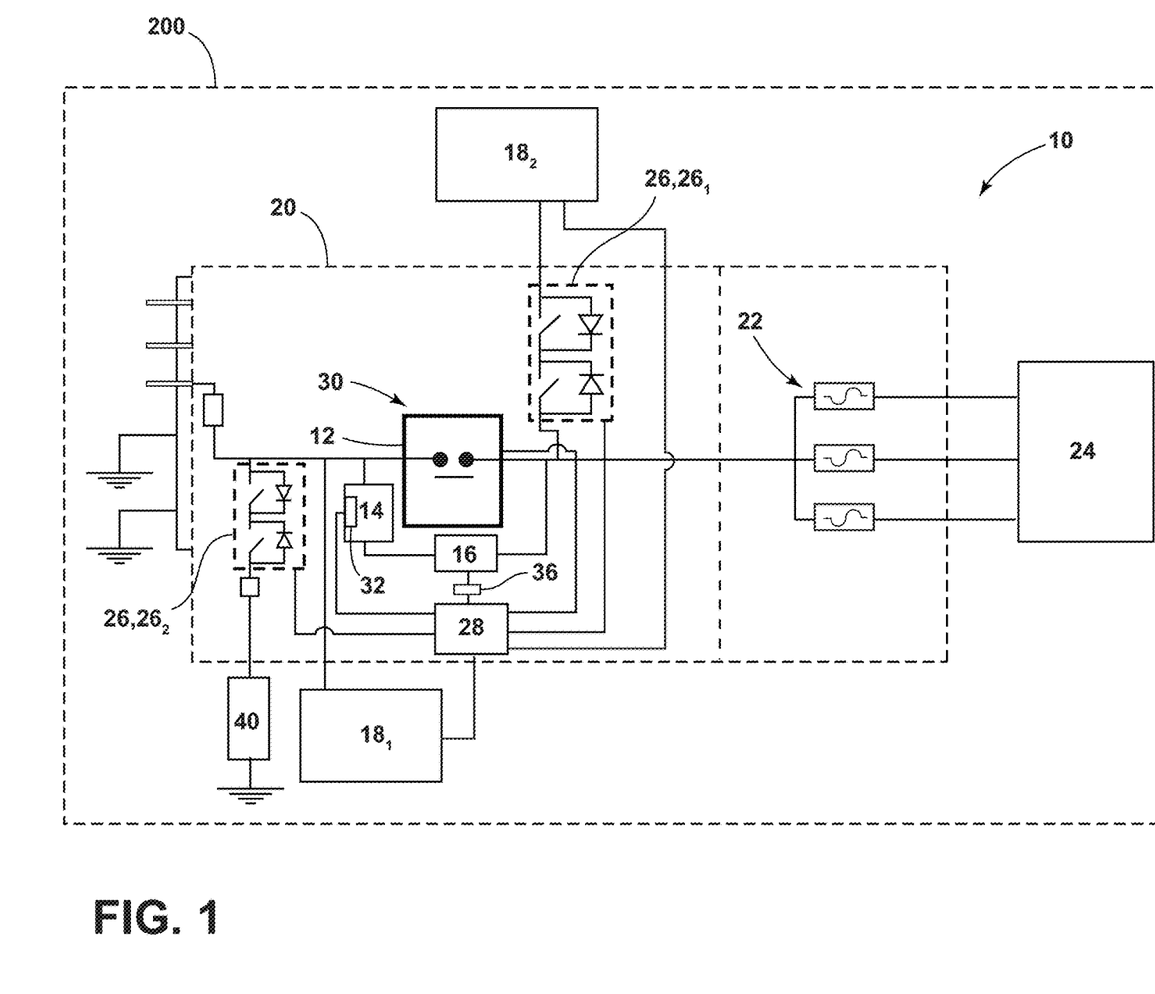
FIG. 1 is a schematic view generally illustrating an embodiment of an electrical assembly.
Figure 2:
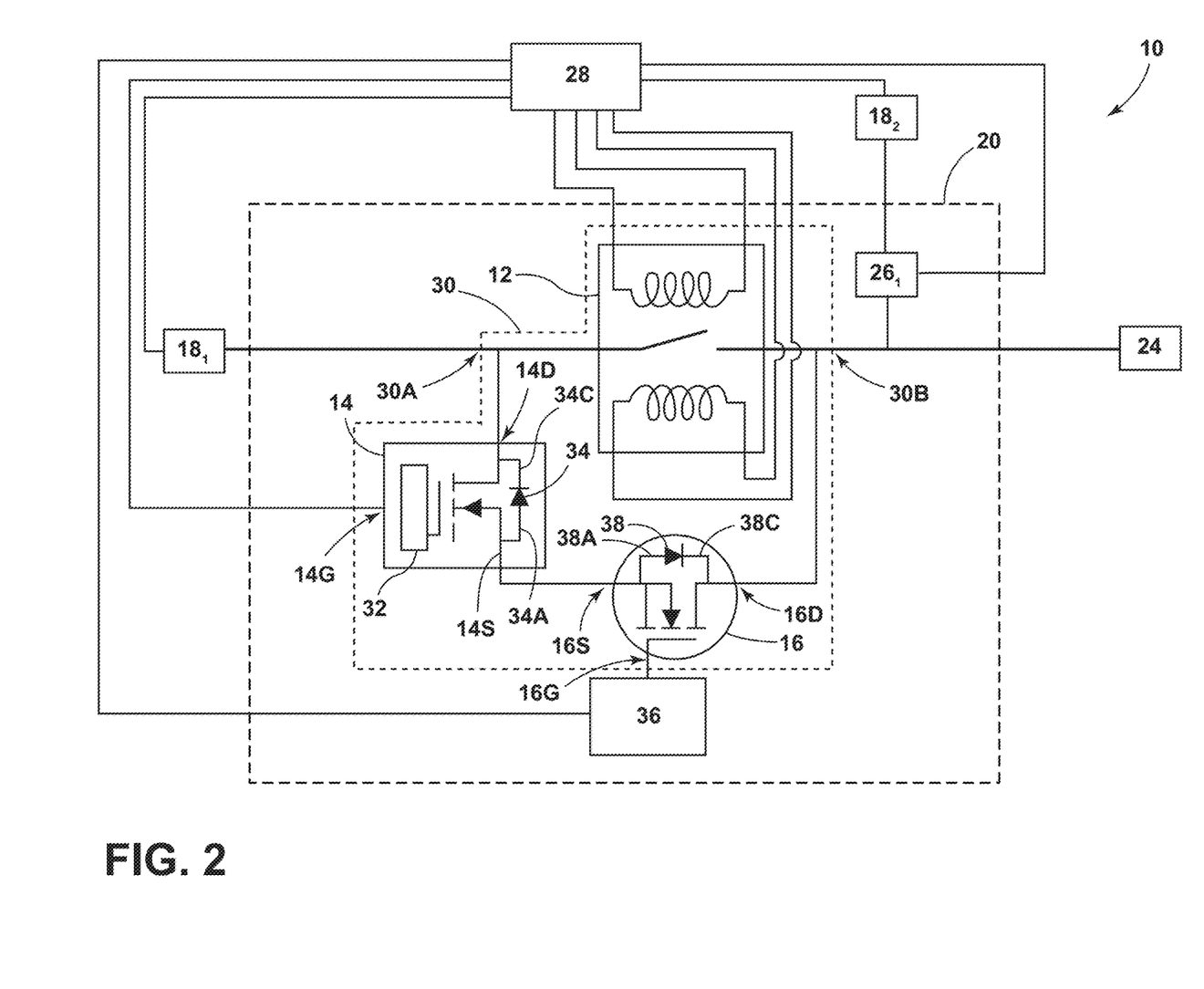
FIG. 2 is a schematic view generally illustrating an embodiment of an electrical assembly.

In embodiments, such as generally illustrated in FIGS. 1 and 2, an electrical assembly 10 may include an electrical component 12, a first switch 14, and/or a second switch 16. The electrical component 12 may include a closed state and an open state. In the closed state, the electrical component 12 may allow bidirectional current flow between its input and output. In the open state, the electrical component 12 may not allow current flow between its input and output. The first switch 14 may be electrically connected to the electrical component 12. The second switch 16 may be electrically connected to the electrical component 12 and/or the first switch 14. The first switch 14 may be connected in series with the second switch 16. The first switch 14 and the second switch 16 may be connected in parallel with the electrical component 12. The first switch 14 and the second switch 16 may be configured to provide electric current (e.g., standby current, temporary current, secondary current, etc.), such as when the electrical component 12 is in the open state.

With embodiments, such as generally illustrated in FIG. 1, a first power source $18_1$ and/or a second power source $18_2$ may be electrically connected to an electrical component 12. A power source $18_1$, $18_2$ may include one or more of a variety of configurations. For example and without limitation, a power source $18_1$, $18_2$ may include a battery, a capacitor, a solar panel, a power converter, and/or an outlet, among others.

In embodiments, an electrical assembly 10 may be disposed at least partially within and/or include an electrical unit 20 (e.g., a circuit breaker unit, a power distribution unit, among others). The electrical assembly 10 may include a plurality of fuses 22 electrically connected to an electrical component 12, a first power source $18_1$, and/or a second power source $18_2$. In some example configurations, an electrical assembly 10, a first power source $18_1$, a second power source $18_2$, and/or an electrical unit 20 may be incorporated with and/or disposed in a vehicle 200, but are not limited to vehicle applications.

With embodiments, a vehicle 200 may include one or more of a variety of configurations. For example and without limitation, a vehicle 200 may include a land vehicle, a passenger car, a van, a sport utility vehicle (SUV), a crossover, a truck (e.g., a pickup truck, a commercial truck, etc.), a bus, a watercraft, an aircraft (e.g., a plane, a helicopter, etc.), and/or a combination thereof (e.g., a vehicle for land and water, a vehicle for air and water, etc.), among others.

In embodiments, a first power source $18_1$ and/or a second power source $18_2$ may be configured to supply power to one or more electrical loads 24 (e.g., one or more vehicle loads, if utilized in a vehicle application). An electrical load 24 may, for example and without limitation, include a single load or a plurality of loads, such as one or more vehicle systems or components (e.g., air conditioner, heater, electric motor, etc.). In some examples of vehicle applications, the one or more electrical loads 24 may include electric motors configured to move a vehicle 200.

In embodiments, such as generally illustrated in FIG. 1, an electrical assembly 10 may include one or more additional electrical components 26 (e.g., additional electrical components $26_1$, $26_2$). An electrical component 12, 26 may include one or more of a variety of configurations. For example and without limitation, an electrical component 12, 26 may include a relay, an electrical switch, a bi-stable relay, and/or a silicon switch, among others and is not limited to a switch.

With embodiments, an electrical component 12, $26_1$ may include a closed state in which the electrical component 12, $26_1$ provides an electrical connection and/or current from a power source $18_1$, $18_2$ to one or more electrical loads 24, and/or an open state in which the electrical component 12, $26_1$ does not provide an electrical connection and/or power from the power source $18_1$, $18_2$ to the one more electrical loads 24. For example, an electrical component 12 may be configured to provide current and/or a first electrical connection from a first power source $18_1$ to one or more electrical loads 24 while in a closed state, and/or the electrical component 12 may not provide current and/or the first electrical connection from the first power source $18_1$ to one or more electrical loads 24 while in the open state. An additional electrical component $26_1$ may be configured to provide power from a second power source $18_2$ to one or more electrical loads 24 while in a closed state, and/or the additional electrical component $26_1$ may not provide power from the second power source $18_2$ to one or more electrical loads 24 while in the open state.

In some instances, a first power source $18_1$, a second power source $18_2$, and/or one or more electrical loads 24 may generate, provide, and/or consume a large electric current via an electrical component 12, 26. For example and without limitation, an electrical assembly 10 and/or an electrical component 12, 26 may be configured for use with currents of at least 200 A.

In embodiments, a controller 28 may be electrically connected to an electrical component 12, 26, a first switch 14, and/or the second switch 16. The controller 28 may be configured to control, at least in part, the electrical component 12, 26, the first switch 14, and/or the second switch 16. In some example configurations, the controller 28 may be configured to control the first switch 14 and the second switch 16 to selectively provide an electric current (e.g., standby current) to one or more electrical loads 24.

With embodiments, such as generally illustrated in FIG. 2, an electrical assembly 10 may include a supply circuit 30. A supply circuit 30 may include an electrical component 12, a first switch 14, and/or a second switch 16. A first power source $18_1$ may be electrically connected to an input 30A of the supply circuit 30 and/or a second power source $18_2$ may be electrically connected to an output 30B of the supply circuit 30. The supply circuit 30 may be configured to selectively provide electrical current/power from the first power source $18_1$ through to one or more electrical loads 24, such as via the electrical component 12, the first switch 14, and/or the second switch 16 (e.g., from the input 30A to the output 30B). In some instances, it may be desirable to limit and/or prevent electric current flow through supply circuit 30 from the second power source $18_2$ (e.g., reverse current flow, etc.), such as during a fault condition.

In embodiments, such as generally illustrated in FIG. 2, a first switch 14 may include an electrical switch. For example and without limitation, the first switch 14 may include a transistor, a field effect transistor (FET), a metal oxide semiconductor field effect transistor (MOSFET), such as n-channel or p-channel MOSFET, a bipolar junction transistor (BJT), and/or a smart FET, among others. The first switch 14 may include a gate 14G, a source 14S, and/or a drain 14D (e.g., terminals). The gate 14G may be electrically connected to a controller 28, the drain 14D may be electrically connected to an input 30A of the supply circuit 30 and/or the electrical component 12, and/or the source 14S may be electrically connected to a second switch 16.

With embodiments, a first switch 14 may include an integrated circuit 32. For example and without limitation, the integrated circuit 32 may be disposed within and/or formed integrally with the first switch 14 (e.g., on the same chip, on the same die, on adjacent dies, etc.). The integrated circuit 32 may include a silicon die, a digital silicon die, and/or a gallium arsenide die, among others. The integrated circuit 32 may be electrically connected (e.g., directly) to a gate 14G, a source 14S, and/or a drain 14D of the first switch 14. A controller 28 may communicate with and/or control the integrated circuit 32. In some instances, the controller 28 and the integrated circuit 32 may communicate via a transmission of voltage signals (e.g., 5 V signal and/or 0 V signal, etc.). In some instances, the controller 28 and the integrated circuit 32 may communicate via a communication bus comprising a digital communication protocol (e.g., transmission of packets of bits). In some examples, an integrated circuit 32 may receive a digital command signal from a controller 28 and/or convert the digital signal to an analog signal to control the first switch 14, such as to activate (e.g., close) and/or deactivate (e.g., open) the first switch 14.

In embodiments, an integrated circuit 32 may be configured to operate as a switch driver for a first switch 14. For example, the integrated circuit 32 may be controlled via a controller 28 to activate (e.g., close) and/or deactivate (e.g., open) the first switch 14. In some example configurations, the integrated circuit 32 and/or a controller 28 may be configured to determine a status of a first switch 14, such as whether the first switch 14 is in an open state (e.g., deactivated state) or a closed state (e.g., activated state).

With embodiments, an integrated circuit 32 may be configured to determine certain properties/parameters of a first switch 14 and/or perform certain diagnostics. For example and without limitation, the integrated circuit 32 may be configured to determine an electric current flow through the first switch 14 and/or a temperature of the first switch 14, among others.

In embodiments, a first switch 14 may include a diode 34. The diode 34 may be a body/intrinsic/parasitic diode. In some example configurations, an anode 34A of the diode 34 may be connected to a source 14S of the first switch 14, and/or a cathode 34C of the diode 34 may be connected to a drain 14D of the first switch 14.

In embodiments, such as generally illustrated in FIG. 2, a second switch 16 may include an electrical switch. For example and without limitation, the second switch 16 may include a transistor, a field effect transistor (FET), a metal oxide semiconductor field effect transistor (MOSFET), such as n-channel or p-channel MOSFET, a bipolar junction transistor (BJT), a smart FET, and/or a silicon die (e.g., bare silicon die), among others. The second switch 16 may include a gate 16G, a source 16S, and/or a drain 16D (e.g., terminals). In some instances, the second switch 16 may include a minimal voltage drop and/or dissipation (e.g., between the source 16S and the drain 16D) when the second switch 16 is closed.

With embodiments, a second switch 16 may be electrically connected to a switch driver 36. The switch driver 36 may be electrically connected to a gate 16G of the second switch 16. The switch driver 36 may be controlled via a controller 28 to activate (e.g., close) and/or deactivate (e.g., open) the second switch 16. For example, the switch driver 36 may provide a voltage to the gate 16G of the second switch 16. In some instances, such as if the second switch 16 includes an n-channel enhancement-type FET, when a voltage supplied to a gate 16G of the second switch 16 is equal to or greater than a threshold voltage, the second switch 16 may be activated (e.g., to a closed state) and electric current may be permitted to flow through the second switch 16. When the voltage supplied to the gate 16G of the second switch 16 is less than the predetermined threshold voltage, the second switch 16 may be deactivated (e.g., in an open state) and the electric current may be prevented from flowing through the second switch 16.

In embodiments, a second switch 16 may include a diode 38. The diode 38 may be a body/intrinsic/parasitic diode. In some example configurations, an anode 38A of the diode 38 may be connected to the source 16S of the second switch 16, and/or a cathode 38C of the diode 38 may be connected to a drain 38D of the second switch 16. In some example configurations, a drain 16D of the second switch 16 may be electrically connected to an output 30B of the supply circuit 30, and/or a source 16S of the second switch 16 may be electrically connected to a first switch 14. The source 16S of the second switch 16 may be electrically connected to a source 14S of the first switch 14, and/or the anode 38A of the diode 38 of the second switch 16 may be electrically connected to an anode 34A of the diode 34 of the first switch 14. Such a configuration of diodes may limit and/or prevent parasitic current flow from the first switch 14 and/or the second switch 16.

In some example configurations, the second switch 16 may normally be in a deactivated/open state in which electric current may be prevented from flowing directly from the source 16S to the drain 16D of the second switch 16, but electric current may still flow through the diode 38 of second switch 16 (e.g., toward the output 30B).

In some embodiments, in a first mode of operation of an electrical assembly 10, one or more loads 24 may be supplied power from a power source $18_1$, $18_2$. For example, electric current may flow from a power source $18_1$ through an electrical component 12 to the one or more loads 24. The electric current flowing through the electrical component 12 may, in some examples, be at least 200 amps. For example and without limitation, the electrical component 12 may have a current capacity (e.g., a first current capacity) of at least 200 A.

In some instances, a second mode of operation of an electrical assembly 10 may be standby and/or a low power mode. In the second mode, some of the one or more loads 24 may not operate and/or some of the one or more loads 24 may draw lower electric currents (e.g., standby currents). In the second mode, an electrical component 12 may be in an open state and electric current may be prevented from flowing through the electrical component 12 and an electric current (e.g., a standby current) may flow from a power source $18_1$ through a first switch 14 and a second switch 16 to the one or more loads 24.

In example configurations, the standby current drawn by the one or more loads 24 in the second mode may be less than the electrical current drawn by the one or more loads 24 when the electrical assembly 10 is in the first mode. For example and without limitation, the second mode/standby current may be 50% or less than the first mode current. In some configurations, the first switch 14 and/or the second switch 16 may include current capacities that are less than the current capacity of the electrical component 12. For example, the current capacities of the first switch 14 and the second switch 16 may be approximately 50% or less of the current capacity of the electrical component 12.

In some example configurations, a controller 28 may be configured to facilitate providing the standby current to the one or more loads 24 when the electrical assembly 10 is in the second mode, such as via closing the first switch 14 and the second switch 16.

In embodiments, an electrical assembly 10 may be configured to detect and/or protect against certain fault conditions (e.g., reverse current, overcurrent and/or short circuit, and/or open circuit, among others). A second switch 16 may be configured to restrict electric current flow from an output 30B of a supply circuit 30 to an input 30A of the supply circuit 30 when an electrical component 12 is in an open state. For example, a diode 38 of the second switch 16 may be configured to prevent a reverse current flow through the second switch 16, which may allow the supply circuit 30 and/or the electrical assembly 10 to provide unidirectional current flow from the input 30A of the supply circuit 30 to the output 30B of the supply circuit 30 and/or from a power source $18_1$ to one or more electrical loads 24 (e.g., prevent current flow from the second power source $18_2$, through the supply circuit 30, to the electrical component 262, and/or to electrical ground). In some configurations, a diode 34 of a first switch 14 may not restrict reverse current. For example, a first switch 14 may operate more efficiently if the drain 14D is connected to the power source $18_1$ than if the source 14S is connected to the power source $18_1$, and the diode 34 may be configured to allow reverse current in such a configuration.

With embodiments, a controller 28 may be configured to selectively open (e.g., deactivate) a first switch 14 and/or the second switch 16 if electric current flowing through the first switch 14 is equal to or greater than a predetermined threshold, such as a current sensed via an integrated circuit 32 of the first switch 14, which may indicate that a short circuit or overcurrent condition is present. For example, if the controller 28 and/or the first switch 14 (e.g., via an integrated circuit 32) determines an occurrence of a fault condition (e.g., overcurrent and/or a short circuit, etc.), the controller 28 may be configured to open the first switch 14 to prevent potential damage to one or more electrical loads 24 or other components. If the first switch 14 senses substantially no current is flowing, the first switch 14 and/or the controller 28 may determine an open circuit condition is present.

With embodiments, an electrical assembly 10 may be configured to conduct diagnostics to confirm that certain components (e.g., power source $18_1$) are functioning properly and/or to determine a status (e.g., health, charge level, etc.) of the components. For example and without limitation, a controller 28 may be configured to determine a status of the power source 18i. Determining the status of the power source $18_1$ may include providing power from the power source $18_1$ to a diagnostic load 40 (e.g., a resistor). Providing power from the power source $18_1$ to the diagnostic load 40 may include closing one or more electrical components/switches 26 (e.g., $26_2$). The controller 28 may be configured to determine a status of the power source $18_1$ according to one or more characteristics of the current provided to the diagnostic load 40. The diagnostic current may, for example and without limitation, be at least 50 A for a duration of at least 5 seconds.

In some configurations, it may be desirable to limit or prevent the power source $18_1$ from providing current to other loads during diagnostics, such as to improve the accuracy of such diagnostics. For example, the controller 28 may open (e.g., deactivate) electrical component 12, the first switch 14, and/or the second switch 16 during diagnostics, which may disconnect the power source $18_1$ from the one or more loads 24. The controller 28 may be configured to determine a status of the power source $18_1$ according to one or more characteristics of the diagnostic current provided to the diagnostic load 40.

In some embodiments, during the diagnostics (e.g., while current is being supplied to the diagnostic load 40), it may be desirable to activate a certain load or loads of the one or more electrical loads 24 (e.g., safety loads, such as electrical power steering (EPS)), such as to provide one or more safety functions that may be a higher priority than conducting diagnostics. In this case, the controller 28 may be configured to activate (e.g., close) the first switch 14 and the second switch 16 to provide a second electrical connection and/or a secondary current from the power source $18_1$ to the certain electrical load or loads 24. The current may be provided to the electrical loads 24 via the first switch 14 and the second switch 16 (e.g., a secondary current via a second electrical connection that may separate from a first current/electrical connection that may be provided via the electrical component 12) because the first switch 14 and the second switch 16 may be activated (e.g., closed) faster than the electrical component 12. For example and without limitation, if the controller 28 determines that a certain load or loads 24 should receive current from the power source $18_1$ during diagnostics of the power source $18_1$, the controller 28 may close or start to close the first and second switches 14, 16 and close the electrical component 12 (e.g., substantially simultaneously) to provide such current. The first and second switches 14, 16 may close faster than electrical component 12, so current (e.g., a secondary current) may be provided, at least temporarily, via the switches 14, 16 (e.g., the second electrical connection) and not via the electrical component 12 (e.g., a first electrical connection). Providing current from the power source $18_1$ to the certain load or loads 24 may alter the current characteristics at the diagnostic load 40 and reduce the accuracy of a status determination of the power source $18_1$, so the controller 28 may ignore or provide less weight to sensed characteristics in such circumstances. In some implementations, after the certain electrical load or loads 24 receive current and/or carry out desired operations, the controller 28 may be configured to reconduct the interrupted diagnostics.

Figure 3:
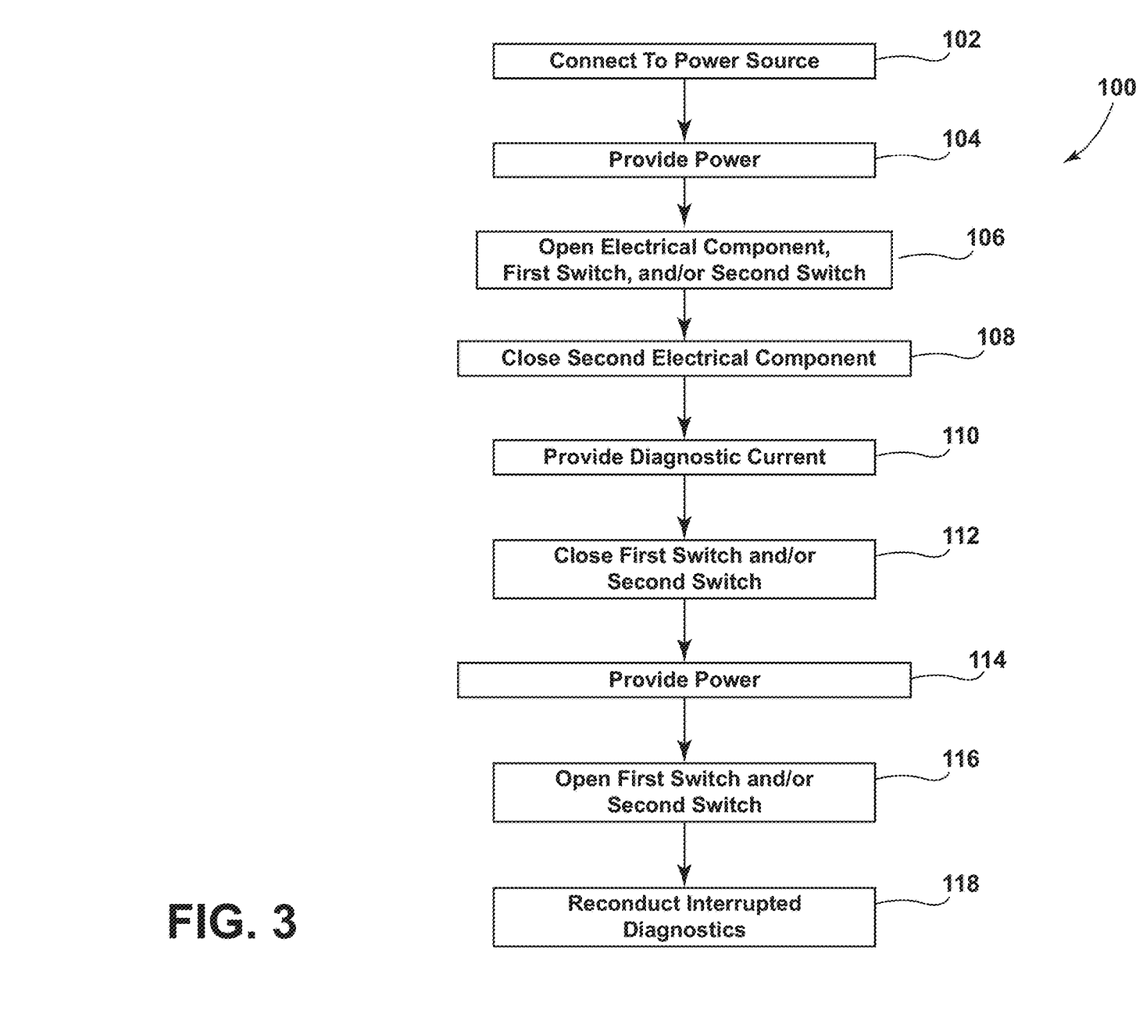
FIG. 3 is a flow diagram generally illustrating an embodiment of a method of operating an electrical assembly.

In embodiments, such as generally illustrated in FIG. 3, a method 100 of operating an electrical assembly 10 may include connecting an electrical assembly 10 and/or an electrical component 12 to a power source (block 102). In some configurations, the power source may include a first power source $18_1$, a second power source $18_2$, and/or one or more additional power sources. Connecting an electrical assembly 10 with the power source may include electrically connecting an electrical component 12 with the power source.

With embodiments, the method 100 may include providing current from a power source to an electrical component 12 and/or to one or more loads 24 (block 104). For example, a controller 28 may close the electrical component 12 and power/current may flow from the power source $18_1$ through the electrical component 12 to one or more electrical loads 24.

In embodiments, the method 100 may include deactivating (e.g., opening) an electrical component 12, a first switch 14, and/or a second switch 16 via a controller 28 (block 106), such as if power from a corresponding power source is not needed, to shift the electrical assembly 10 to a second mode (e.g., if a system/vehicle 200 is in a standby and/or a low power consumption mode, for an example vehicle application), and/or to conduct certain diagnostics to confirm that certain components (e.g., power source $18_1$) are functioning properly and/or to determine a status of the components.

With embodiments, the method 100 may include activating (e.g., closing) an electrical component 26 (e.g., a second electrical component $26_2$) via a controller 28 (block 108), and/or providing a diagnostic current from power source $18_1$ to a diagnostic load 40 via the electrical component $26_2$ to conduct diagnostics (block 110), such as to determine the status of the power source $18i$. Conducting the diagnostics may, for example, include the controller 28 monitoring one or more characteristics of the current provided to the diagnostic load 40.

With embodiments, the method 100 may include (e.g., during the diagnostics) closing the first switch 14 and the second switch 16 (block 112) such that a secondary current is provided from the power source $18_1$ to a certain load or loads of one or more electrical loads 24 (e.g., priority/safety loads) (block 114). The diagnostics may be interrupted and/or altered while current is supplied to the certain load or loads 24.

In embodiments, the method 100 may include the controller 28 opening the first switch 14 and the second switch 16 after the safety loads 24 receive power/current and/or carry out the required operations (block 116), and/or reconducting the interrupted diagnostics (block 118).

Providing current to the one or more electrical loads 24 (e.g., in block 104) may include providing unidirectional current and/or limiting/preventing reverse current flow. For example and without limitation, the first switch 14 and the second switch 16, when closed, may provide a current path parallel to the electrical component 12 through which current may flow even when the electrical component 12 is in an open state. In an open state of the second switch 16, the second switch 16 may prevent reverse current flow through the parallel path (e.g., from the second power source $18_2$ through the supply circuit 30 (e.g., from the output 30B to the input 30A) to the electrical component $26_2$.

Embodiments of electrical assemblies 10 may have advantages compared to other designs, such as providing sensing/diagnostics, providing redundancy, providing unidirectional current flow, and/or having lower power consumption (with lower heat dissipation implications), and/or may utilize fewer, smaller, more efficient, and/or less expensive components and/or compared to other designs. For example and without limitation, diodes 34, 38 may include body/intrinsic diodes that may have lower voltage drops and/or may generate less heat than other diodes (e.g., Schottky diodes). Additionally or alternatively, in a closed state, a second switch 16 may operate functionally as an ideal diode (e.g., with a low voltage drop). For example, if a diode was used instead of a second switch 16, the diode may have a significantly greater voltage drop than a second switch 14 in a closed state. Additionally or alternatively, an integrated circuit 32 of a first switch 14 (e.g., a smart FET) may be smaller, consume less power, and/or be less expensive than a separate current sensor (e.g., a Hall effect sensor).

In examples, a controller (e.g., the controller 28) may include an electronic controller and/or include an electronic processor, such as a programmable microprocessor and/or microcontroller. In embodiments, a controller may include, for example, an application specific integrated circuit (ASIC). A controller may include a central processing unit (CPU), a memory (e.g., a non-transitory computer-readable storage medium), and/or an input/output (I/O) interface. A controller may be configured to perform various functions, including those described in greater detail herein, with appropriate programming instructions and/or code embodied in software, hardware, and/or other medium. In embodiments, a controller may include a plurality of controllers. In embodiments, a controller may be connected to a display, such as a touchscreen display.

Various examples/embodiments are described herein for various apparatuses, systems, and/or methods. Numerous specific details are set forth to provide a thorough understanding of the overall structure, function, manufacture, and use of the examples/embodiments as described in the specification and illustrated in the accompanying drawings. It will be understood by those skilled in the art, however, that the examples/embodiments may be practiced without such specific details. In other instances, well-known operations, components, and elements have not been described in detail so as not to obscure the examples/embodiments described in the specification. Those of ordinary skill in the art will understand that the examples/embodiments described and illustrated herein are non-limiting examples, and thus it can be appreciated that the specific structural and functional details disclosed herein may be representative and do not necessarily limit the scope of the embodiments.

Reference throughout the specification to "examples, "in examples," "with examples," "various embodiments," "with embodiments," "in embodiments," or "an embodiment," or the like, means that a particular feature, structure, or characteristic described in connection with the example/embodiment is included in at least one embodiment. Thus, appearances of the phrases "examples, "in examples," "with examples," "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more examples/embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of examples/embodiments.

Joinder references (e.g., attached, coupled, connected, and the like) are to be construed broadly and may include intermediate members between a connection of elements, relative movement between elements, direct connections, indirect connections, fixed connections, movable connections, operative connections, indirect contact, and/or direct contact. As such, joinder references do not necessarily imply that two elements are directly connected/coupled and in fixed relation to each other. Connections of electrical components, if any, may include mechanical connections, electrical connections, wired connections, and/or wireless connections, among others. Uses of "e.g." and "such as" in the specification are to be construed broadly and are used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

What is claimed is:

1. An electrical assembly, comprising:
   an electrical component configured to provide a first electrical connection, the electrical component including a closed state and an open state;
   a first switch electrically connected to the electrical component;
   a second switch electrically connected to the electrical component and the first switch, the second switch connected in series with the first switch, and the first switch and the second switch connected in parallel with the electrical component; and
   a controller electrically connected to the electrical component, the first switch, and the second switch; the controller configured to control the electrical component, the first switch, and the second switch;
   wherein the first switch and the second switch are configured to provide a second electrical connection when the electrical component is in the open state.

2. The electrical assembly of claim 1, including a switch driver electrically connected to the controller and the second switch.

3. The electrical assembly of claim 1, wherein the controller is configured to control the first switch and the second switch to selectively provide current, via the second electrical connection, to one or more electrical loads.

4. The electrical assembly of claim 1, including:
   a first power source electrically connected to the electrical component; and
   a second power source electrically connected to the electrical component;
   wherein the first power source and the second power source are configured to supply power for one or more electrical loads.

5. The electrical assembly of claim 4, including a supply circuit including the first switch, the second switch, and the electrical component;

wherein the first power source is electrically connected to an input of the supply circuit;
the second power source is electrically connected to an output of the supply circuit; and
the second switch is configured to restrict current flow from the output of the supply circuit to the input of the supply circuit when the electrical component is in the open state such that current flows unidirectionally through the supply circuit.

6. The electrical assembly of claim 1, wherein the first switch includes an integrated circuit configured to perform diagnostics; and
the diagnostics include a current flow detection through the first switch and/or a temperature detection of the first switch.

7. The electrical assembly of claim 6,
wherein at least one of the controller and the integrated circuit is configured to open the first switch if electric current at the first switch is equal to or greater than a threshold.

8. The electrical assembly of claim 1, including:
a second electrical component electrically connected to the controller and a power source; and
a diagnostic load electrically connected to the second electrical component;
wherein the controller is configured to control the second electrical component to provide a diagnostic current from the power source to the diagnostic load; and
the controller is configured to determine a status of the power source according to one or more characteristics of the diagnostic current.

9. The electrical assembly of claim 8, wherein the diagnostic current is at least 50 A.

10. The electrical assembly of claim 1, wherein a source of the first switch is electrically connected to a source of the second switch.

11. The electrical assembly of claim 10, wherein the first switch includes a first diode;
the second switch includes a second diode; and
an anode of the first diode is electrically connected to an anode of the second diode.

12. The electrical assembly of claim 11, wherein the second diode is configured to prevent a reverse current flow through the first switch and the second switch.

13. The electrical assembly of claim 1, wherein the electrical component includes a first current capacity; and
current capacities of the first switch and the second switch are less than the first current capacity.

14. The electrical assembly of claim 1, wherein the electrical component includes a relay;
electric current is permitted to flow through the electrical component if the electrical component is in the closed state;
the electric current is prevented from flowing through the electrical component if the electrical component is in the open state; and
the electrical component has a current capacity of at least 200 A.

15. A vehicle, comprising:
the electrical assembly of claim 1;
wherein the controller controls current to one or more electrical loads, and the one or more electrical loads include one or more vehicle loads.

16. The vehicle of claim 15, wherein the controller is configured to facilitate providing a secondary current via the first switch and the second switch to the one or more vehicle loads when the electrical component is in the open state.

17. A method of operating the electrical assembly of claim 1, the method comprising:
providing power from a power source to the electrical component;
opening, via the controller, the electrical component, the first switch, and the second switch;
closing, via the controller, a second electrical component; and
providing, via the second electrical component, a diagnostic current from the power source to a diagnostic load to determine a status of the power source.

18. The method of operating the electrical assembly of claim 17, including:
closing the first switch and the second switch via the controller; and
providing current to one or more electrical loads via the first switch and the second switch.

19. The method of operating the electrical assembly of claim 17, including restricting reverse current flow via the second switch when the second switch is open.

* * * * *